(12) United States Patent
Fukuoka et al.

(10) Patent No.: US 8,217,313 B2
(45) Date of Patent: Jul. 10, 2012

(54) HEATING APPARATUS AND HEATING METHOD

(75) Inventors: Tetsuo Fukuoka, Koshi (JP); Takahiro Kitano, Koshi (JP); Kazuo Terada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 631 days.

(21) Appl. No.: 12/022,489

(22) Filed: Jan. 30, 2008

(65) Prior Publication Data
US 2008/0185370 A1 Aug. 7, 2008

(30) Foreign Application Priority Data

Feb. 2, 2007 (JP) ................. 2007-024487

(51) Int. Cl.
*F27B 5/14* (2006.01)
*C23C 16/00* (2006.01)

(52) U.S. Cl. ........ 219/390; 219/385; 219/405; 219/411; 118/724; 118/725; 118/50.1; 118/728; 118/730; 392/416; 392/418

(58) Field of Classification Search .................. 219/390, 219/405, 411, 385; 118/724, 725, 50.1, 728–730; 392/416, 418
See application file for complete search history.

(56) References Cited

U.S. PATENT DOCUMENTS

| | | | |
|---|---|---|---|
| 6,113,703 A | * | 9/2000 | Anderson et al. |
| 6,291,800 B1 | | 9/2001 | Shirakawa et al. |
| 6,380,518 B2 | | 4/2002 | Shirakawa et al. |
| 2007/0048979 A1 | | 3/2007 | Fukuoka et al. |

FOREIGN PATENT DOCUMENTS

JP 11-238663 8/1999

* cited by examiner

*Primary Examiner* — Shawntina Fuqua
(74) *Attorney, Agent, or Firm* — Oblon, Spivak, McClelland, Maier & Neustadt, L.L.P.

(57) ABSTRACT

A disclosed heating apparatus includes a heating chamber configured to heat a substrate placed in the heating chamber with a heat plate opposing the substrate; a gas stream forming portion that creates a gas stream along a top surface of the substrate in the heating chamber; and a pair of first plate members respectively located between an inner side wall of the heating chamber and a first substrate edge opposing the inner side wall, and between another inner side wall of the heating chamber and a second substrate edge opposing the other inner side wall.

6 Claims, 16 Drawing Sheets

SIMULATION PARAMETERS
R : 0.35mm
a : 0.35± 0.1mm
θ : 22°

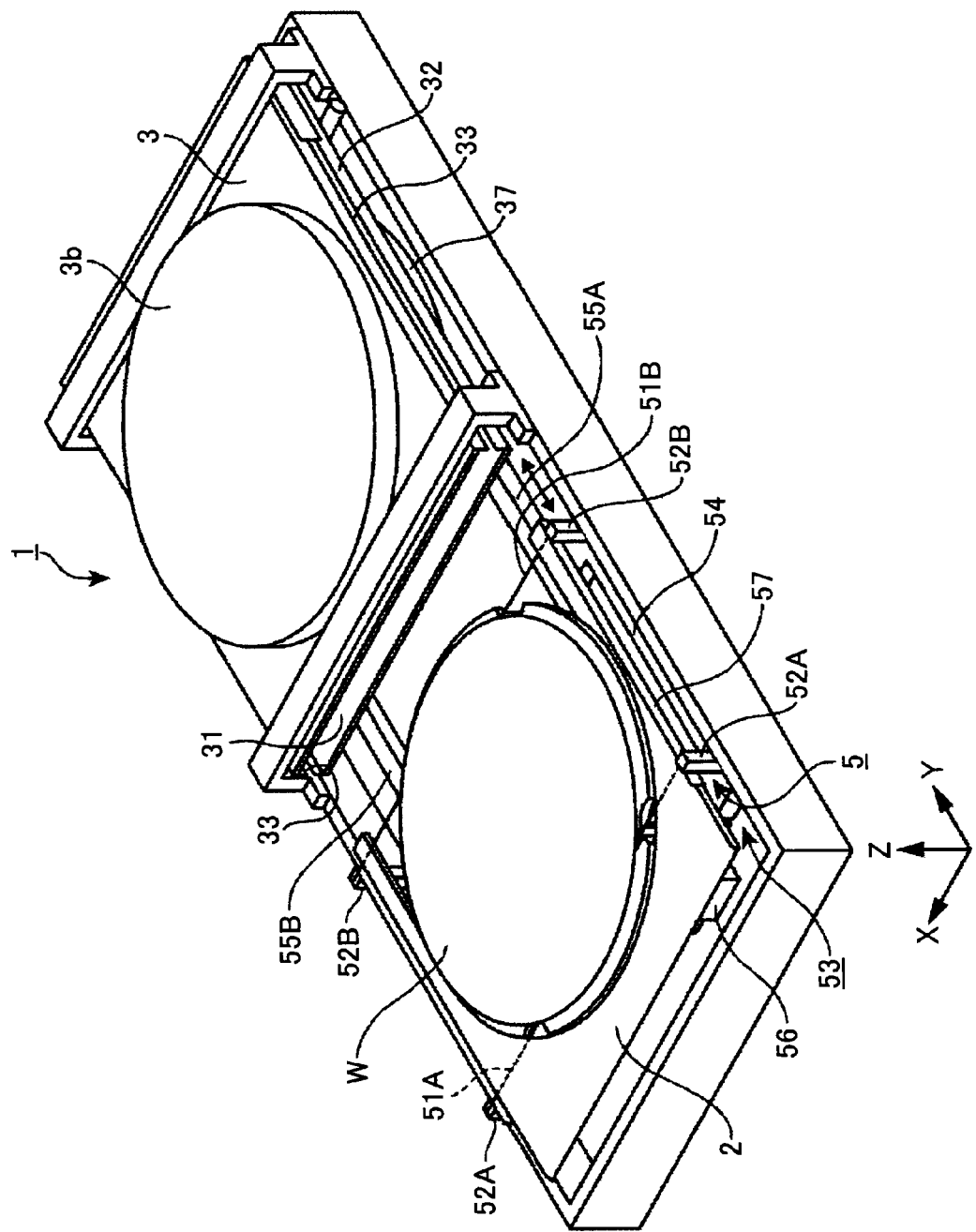

⊗: GAS STREAM ALONG THE DIRECTION FROM FRONT TO BACK OF THE SHEET

HEATING APPARATUS AND HEATING METHOD

BACKGROUND OF THE INVENTION

1. Field of the Invention

The present invention relates to a heating apparatus and a heating method for heating a substrate on which a resist solution or the like is coated.

2. Description of the Related Art

In order to form a resist mask on a semiconductor wafer (referred to as a wafer, hereinafter), a glass substrate for a liquid crystal display (LCD), or the like, there is used a coater/developer that coats a resist solution on the wafer or the like and develops a resist film that has undergone lithographic exposure. The coater/developer includes a heating apparatus, which is also known as a baking apparatus. The heating apparatus is used to heat the wafer and the resist solution on the wafer so as to evaporate solvents in the resist solution and the wafer having the exposed resist film.

SUMMARY OF THE INVENTION

Among such heating apparatuses, a heating apparatus that has two heat plates that heat the wafer from above and below the wafer in a heating chamber has been under development by the inventors of the present invention. In this heating apparatus, a gas stream is created over the wafer in a direction from an opening provided in one end of the heating chamber to the other end of the heating chamber. Such a configuration is advantageous in that the gas stream can carry away sublimated substances from the resist solution, thereby reducing particles that originate from the substances and attached on the wafer.

FIGS. 1A and 1B are schematic cut-away diagrams of a heating apparatus 100 including a heating chamber having such a configuration. The heating apparatus 100 includes a heating chamber 101 realized in a flattened chassis. The heating chamber 101 has in one side an opening 101a, in front of which a cooling plate 105 for cooling a thermally processed wafer W is located. In addition, the heating apparatus 100 has two wires on which the wafer W is placed and transferred in or out from the heating chamber in order to save time necessary for transferring the wafer W in or out from the heating chamber 101 and reduce the height of the heating chamber 101.

Next, operations of the heating apparatus 100 are described in the following. The wafer on which a resist solution is coated in a coating unit in a previous process is transferred into the heating apparatus 100 by a wafer transfer mechanism outside of the heating apparatus 100 and placed on the cooling plate 105 as shown in FIG. 1A. The cooling plate 105 has, for example, two grooves 105a in which the two wires 104A, 104B are stretched in a direction intersecting the direction of the transfer path of the wafer W. After the cooling plate 105 is brought down so that the wafer W is received by the two wires 104A, 104B, the wires 104A, 104B are slid by a driving mechanism (not shown), so that the wafer W is transferred into the heating chamber 101 through the opening 101a.

At this time, the heat plates 102A, 102B located in the upper and the lower portions of the heating chamber 100 are heated so as to be ready to heat the wafer W. When the wafer W is in the heating chamber 100, a gas injection portion 103a arranged near the opening 101a heats gas and supplies the heated gas to the heating chamber 100 through the opening 101a. The gas supplied into the heating chamber 100 flows through the heating chamber 100 and is evacuated from the gas evacuation portion 103b, so that a gas stream flowing in one direction is created in the heating chamber 100. The wafer W is still held by the wires 104A, 104B and not placed directly on the heat plate 102B, and heated by the heat plates 102A, 102B, so that the solvents in the resist solution are evaporated. After this heating is completed, the wafer W is transferred back to the cooling plate 105, on which the wafer W is cooled to a temperature that can be readily handled in subsequent processes, and transferred from the heating apparatus 100.

By the way, the coater/developer is desired to have a smaller foot print while the diameter of the wafer to be processed in the coater/developer becomes larger, which requires downsizing various units mounted in the coater/developer. Under such situation the inventors of the present invention have tried to downsize the heating apparatus, which is one of the units in the coater/developer, by decreasing the height of the heating chamber, which has been typically about 6 mm, to about 3 mm.

When the height of the heating chamber is decreased to half, a gas stream passage between the top surface of the wafer and the ceiling of the heating chamber, which allows the gas to flow in one direction in the heating chamber, may be only 1 mm or so.

If the gas is supplied to such a flattened heating chamber in the heating chamber 101, the gas tends to diverge to both sides of the heating chamber 101, as shown by curved arrows in FIG. 2A, which may be caused by a higher pressure loss (pneumatic resistance) in the center of the heating chamber 101. Such an uneven flow pattern leads to non-uniform heating, which may result in a non-uniform property in the resist film.

In order to eliminate such a disadvantage, it may be contemplated that the width (length in an X direction) of the heating chamber 101 shown in FIG. 2A be reduced in order to direct the gas toward the center of the heating chamber 101. However, when the side walls come close to the wafer edge, gas viscosity against the side walls may decrease the gas speed near the side walls and increase the gas speed in the center of the heating chamber, as shown in FIG. 2B. As a result, uneven heating of the wafer W cannot be corrected. By the way, it is noted in FIGS. 2A and 2B that the gas flows faster in an area with closely arranged arrows, and slower in an area with sparsely arranged arrows.

In addition to the above disadvantages, when the height of the heating chamber 101 is reduced, a larger portion of the gas supplied to the heating chamber 101 from the gas injection portion 103a (FIG. 1B) may hit the wafer edge that has slanted surfaces, which are also referred to as bevels, as shown in FIG. 3A. According to simulation results by the inventors of the present invention, shear stress caused in the wafer edge by the gas flowing in one direction in the heating chamber 101 takes a peak value at the bevels, as shown in FIG. 3B.

When particles are attached on the bevels to which such a high shear stress is caused, the particles may be carried by the gas to the center of the wafer W so as to contaminate the wafer, which may reduce the production yield. In addition, when the coater/developer including the heating apparatus with the heating chamber 101 is used along with an immersion lithography system, a protection film called a top coat film formed on the resist film on the wafer W usually reaches the bevels. In this case, the top coat film may be exfoliated by the strong shear force shown in FIG. 3B, which in turn contaminates the wafer W.

By the way, Patent Document 1 listed below describes a heating apparatus of the above-stated type but does not mention disadvantages caused by the deflections of the gas flow and the gas hitting the wafer edge.

Patent Document 1: Japanese Laid-Open Patent Publication No. H11-238663 (paragraphs 0115 through 0122, and FIG. 8)

The present invention has been made in view of the above, and is directed to a heating apparatus and a heating method which can uniformly heat a substrate.

A first aspect of the present invention provides a heating apparatus including a heating chamber configured to heat a substrate placed in the heating chamber with a heat plate opposing the substrate; a gas stream forming portion that creates a gas stream along a top surface of the substrate in the heating chamber; and a pair of first plate members respectively located between one inner side wall of the heating chamber and a first substrate edge opposing the inner side wall, and between the other inner side wall of the heating chamber and a second substrate edge opposing the other inner side wall.

A second aspect of the present invention provides a heating apparatus according to the first aspect, further including a second plate member located at an upstream position along the gas stream in relation to the substrate.

A third aspect of the present invention provides a heating apparatus according to the second aspect, wherein the second plate member becomes thinner toward a direction opposite to a direction of the gas stream.

A fourth aspect of the present invention provides a heating apparatus according to the second or the third aspect, wherein the pair of the first plate members and the second plate member are integrated.

A fifth aspect of the present invention provides a heating apparatus according to any one of the first through fourth aspects, wherein the pair of the first plate members has substantially the same thickness as the substrate and is positioned at substantially the same level as the substrate.

A sixth aspect of the present invention provides a heating apparatus according to any one of the first through fifth aspects, wherein the pair of the first plate members is attached on a transfer portion that transfers the substrate to the heating chamber and supports the substrate in the heating chamber.

A seventh aspect of the present invention provides a heating apparatus according to any one of the first through sixth aspects, wherein the pair of the first plate members is attached on a transfer portion that transfers the substrate to and supports the substrate in the heating chamber.

An eighth aspect of the present invention provides a heating apparatus according to the seventh aspect, wherein the transfer portion includes plural wires that support the back surface of the substrate.

A ninth aspect of the present invention provides a heating apparatus according to any one of the first through eighth aspects, wherein the height of the heating chamber is three times or less than a thickness of the substrate to be heated in the heating chamber.

A tenth aspect of the present invention provides a heating apparatus including a heating chamber configured to heat a substrate placed in the heating chamber by a heat plate opposing the substrate; a gas stream forming portion that creates a gas stream along a top surface of the substrate in the heating chamber; and a plate member located at an upstream position along the gas stream in relation to the substrate.

An eleventh aspect of the present invention provides a heating apparatus according to the tenth aspect, wherein the plate member has substantially the same thickness as the substrate and is positioned at substantially the same level as the substrate.

A twelfth aspect of the present invention provides a heating apparatus according to the tenth or the eleventh aspect, wherein the plate members is attached on a transfer portion that transfers the substrate to the heating chamber and supports the substrate in the heating chamber.

A thirteenth aspect of the present invention provides a heating apparatus according to any one of the tenth through twelfth aspects, wherein the plate members is attached on a transfer portion that transfers the substrate to the heating chamber and supports the substrate in the heating chamber.

A fourteenth aspect of the present invention provides a heating apparatus according to the thirteenth aspect, wherein the transfer portion includes plural wires that support the back surface of the substrate.

A fifteenth aspect of the present invention provides a heating apparatus according to any one of the tenth through fourteenth aspects, wherein the height of the heating chamber is three times or less of a thickness of the substrate to be heated in the heating chamber.

A sixteenth aspect of the present invention provides a substrate heating method of heating a substrate in a heating chamber, the method comprising steps of: transferring the substrate to the heating chamber so that the substrate opposes a heat plate provided in the heating chamber; preparing a pair of first plate members in the heating chamber so that the first plate members are respectively located between one inner side wall of the heating chamber and a first substrate edge opposing the inner side wall, and between the other inner side wall of the heating chamber and a second substrate edge opposing the other inner side wall; heating the substrate with the heat plate; and creating a gas flow in one direction along the top surface of the substrate in the heating chamber.

A seventeenth aspect of the present invention provides a substrate heating method according to the sixteenth aspect, further including a step of preparing a second plate member located at an upstream position along the gas stream in relation to the substrate.

An eighteenth aspect of the present invention provides a substrate heating method of heating a substrate in a heating chamber, the method including steps of: transferring the substrate to the heating chamber so that the substrate opposes a heat plate provided in the heating chamber; preparing a plate member located at an upstream position along the gas stream in relation to the substrate; heating the substrate with the heat plate; and creating a gas flow in one direction along the top surface of the substrate in the heating chamber.

According to one embodiment of the present invention, since the first plate members are located respectively between one inner side wall of the heating chamber and a first substrate edge opposing the inner side wall, and between the other inner side wall of the heating chamber and a second substrate edge opposing the other inner side wall, the gas flow speed of the gas flowing through gas stream passages in the heating chamber can be uniform in the heating chamber. As a result, when heating the substrate so as to evaporate solvents from a resist solution or the like coated on the substrate, the resist solution or the like can be evenly heated over the substrate. Therefore, the property of the resist film which has been heated can also be uniform, thereby preventing a reduction of the production yield. In addition, such effects can be demonstrated even in a flattened heating chamber, thereby downsizing the heating apparatus.

BRIEF DESCRIPTION OF THE DRAWINGS

Other objects, features and advantages of the present invention will become more apparent from the following detailed description when read in conjunction with the accompanying drawings, in which:

FIG. 4 is a perspective view of an inner configuration of a heating apparatus according to one embodiment of the present invention;

DETAILED DESCRIPTION OF THE PREFERRED EMBODIMENT

Figure 1A:
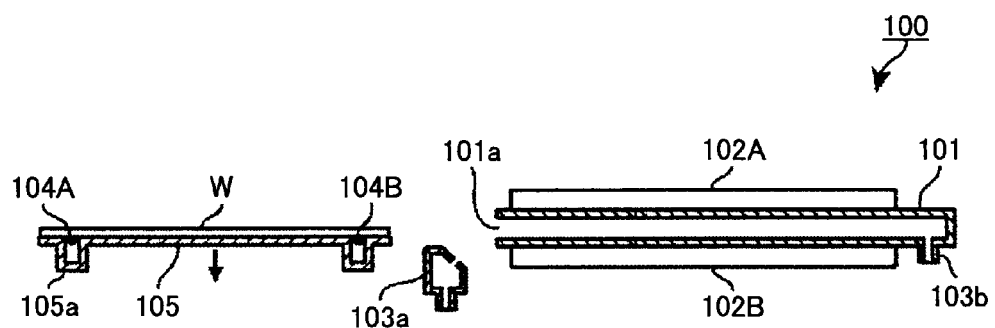
FIGS. 1A and 1B are elevational cut-away diagrams illustrating a primary portion of a heating chamber of a related art heating apparatus.
Figure 1B:
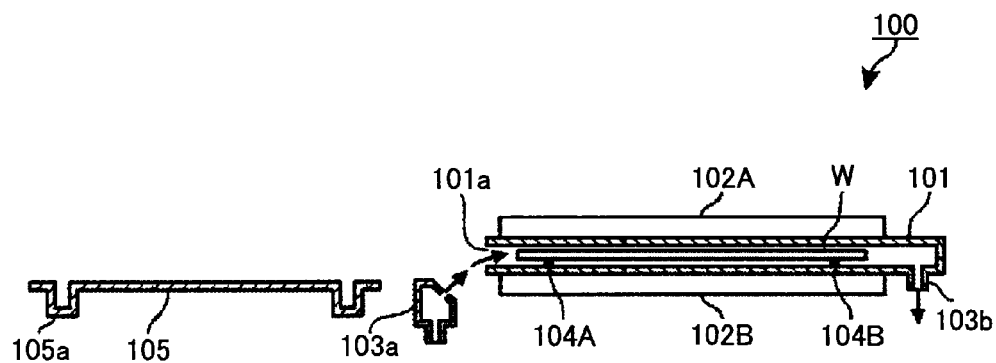

Referring to the accompanying drawings, a heating apparatus according to exemplary embodiments of the present invention will be described. In the drawings, the same or corresponding reference marks are given to the same or corresponding members or components. It is to be noted that the drawings are illustrative of the invention, and there is no intention to indicate scale or relative proportions among the members or components. Therefore, the specific size should be determined by a person having ordinary skill in the art in view of the following non-limiting embodiments.

Figure 5:
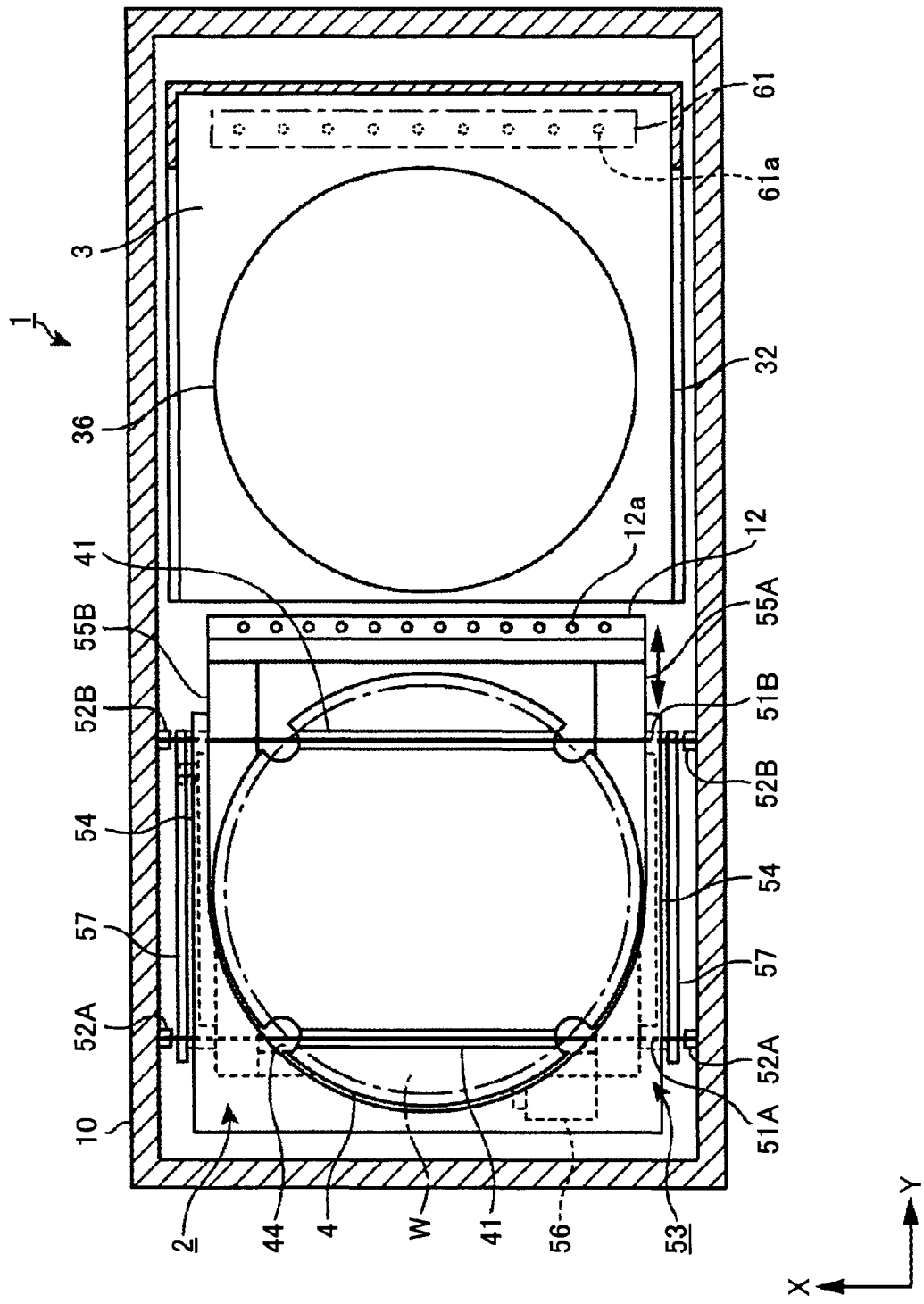
FIG. 5 is a plan view of the heating apparatus shown in FIG. 4.
Figure 6:
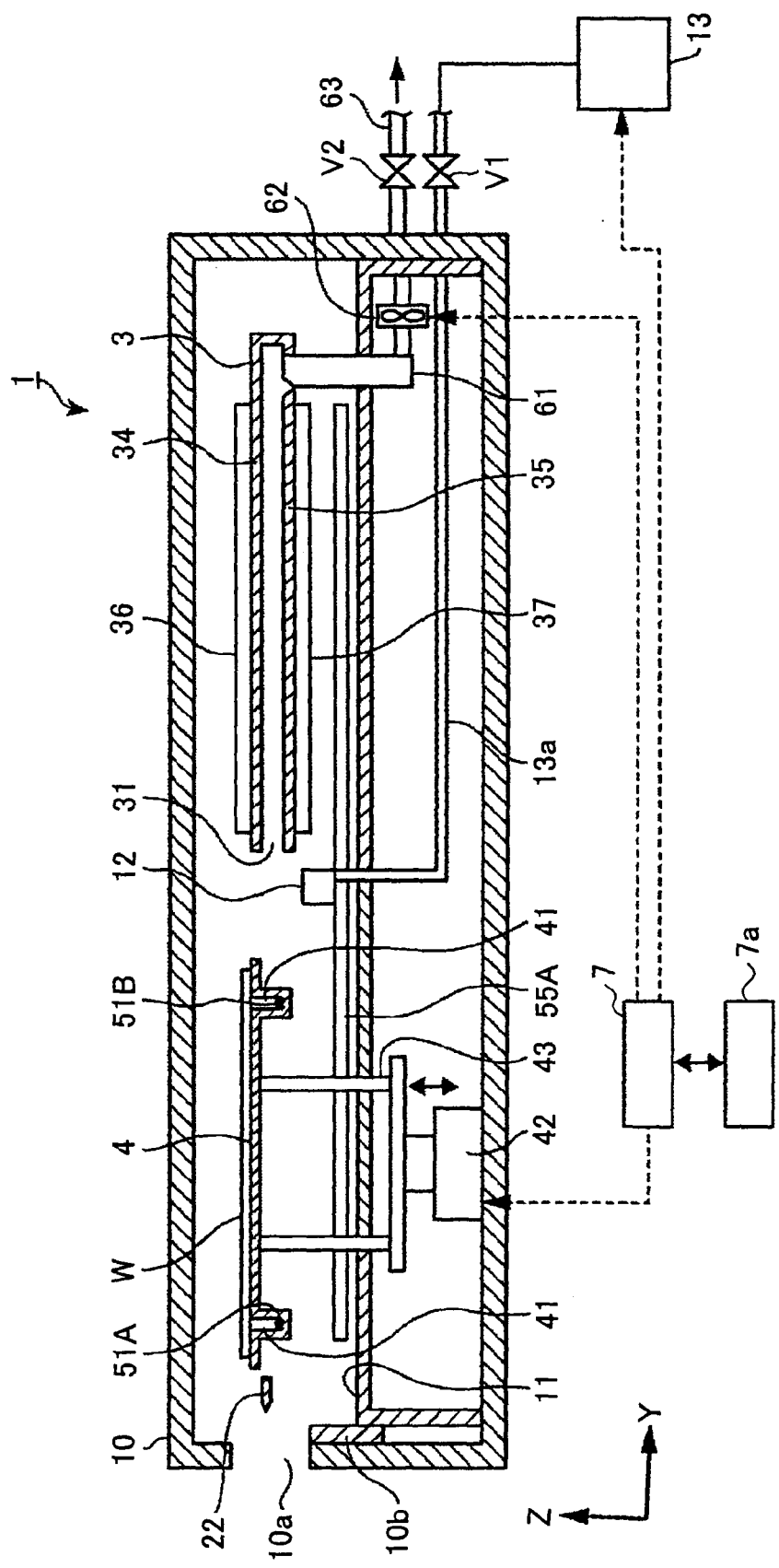
FIG. 6 is an elevational cut-away diagram of the heating apparatus shown in FIG. 4.

FIG. 4 is a perspective view illustrating an inner configuration of a heating apparatus according to an embodiment of the present invention. FIGS. 5 and 6 are a plan view and a cut-away elevational view of the inner configuration of the heating apparatus in FIG. 4, respectively.

Referring to FIGS. 5 and 6, a heating apparatus 1 is housed in a process container 10 that is partitioned into a upper portion and a lower portion by a base 11 (FIG. 6). The upper portion includes a flattened heating chamber 3 in which a wafer W is thermally processed, a cooling plate 4 that cools the wafer W after the thermal process and provides a stand-by position where the wafer W transferred into the process container 10 is temporarily held, and a transfer mechanism 5 (FIG. 4) that transfers the wafer W to/from the cooling plate 4 from/to the heating chamber 3. In addition, the process container 10 has an opening 10a through which the wafer W is transferred in and out from the process container 10 and a shutter 10b that opens/closes the opening 10a. In the following explanation, the surface of the process container 10 in a negative Y direction (FIG. 6), or the surface having the opening 10a, is referred to as the front of the heating apparatus 1, for simplicity of the explanation.

First, the cooling plate 4 is described in detail. The cooling plate 4 is made of, for example, aluminum or the like and substantially shaped into a circular plate having about the same diameter as the 12 inch wafer W, as shown in FIGS. 5 and 6. In addition, the cooling plate 4 has a thickness of about 4 mm except for an area where grooves are formed. Moreover, a cooling mechanism (not shown) that can provide, for example, a temperature-controlled water is arranged on the back side of the cooling plate 4, so that the wafer W placed on the cooling plate 4 can be cooled to a temperature that can be readily handled in a subsequent process.

The transfer mechanism 5 includes plural wires 51A, 51B that can hold and transfer the wafer W, wire supporting portions 52A, 52B that support the wires 51A, 51B, and a driving mechanism 53 that drives the wire supporting portions 52A, 52B, as shown in FIG. 4. For example, the plural (two) wires 51A, 51B are extended in a direction (the X direction in FIG. 5) intersecting the direction (the Y direction in FIG. 5) along which the wafer W is transferred, and supported at both ends by the wire supporting portions 52A, 52B so as to be stretched across the cooling plate 4. The wires 51A, 51B are longer than the diameter of the cooling plate 4 and the wafer W, have a diameter of about 0.5 mm, and are made of a heat resistive material such as aramid fiber, silicon carbide fiber, or the like.

The wire supporting portions 52A, 52B are arranged so as to oppose each other with the cooling plate 4 between the wire supporting portions 52A, 52B, so that the wires 51A, 51B are supported with a predetermined tension by the wire supporting portions 52A, 52B, respectively. The wire supporting portions 52A, 52B are configured so as to transfer the wafer W between the heating chamber 3 and the position above the cooling plate 4 by use of the driving mechanism 53. In the following, when the wires 51A, 51B are with the cooling plate 4, the wires 51A, 51B are described in a manner that the wires 51A, 51B reside in a home position. In addition, a leading end of the wafer W which is transferred along the direction from the cooling plate 4 to the heating chamber 3 is called a front end and the opposite end is called a rear end.

In the driving mechanism 53, the wire support portions 52A, 52B are fixed at their base portions on a base member 54 as shown in FIG. 5. The base member 54 is driven by a driving portion 56 so as to move along two guide rails 55A, 55B arranged in parallel with the direction along which the wafer W is transferred. In addition, shield plates 57 are extended in a belt shape from the wire 51A to the wire 51B. The shield plates 57 serve as lids against slits 33 into which the wires 51A, 51B move, respectively, thereby preventing gas in the heating chamber 3 from being leaked through the slits 33.

Moreover, the cooling plate 4 includes grooves 41 in which the wires 51A, 51B are fitted, respectively, as shown in FIGS. 5 and 6. Specifically, the grooves 41 are arranged so as to correspond to the two wires 51A, 51B in the home position and to intersect the direction along which the wafer W is transferred. The grooves 51A, 51B have widths sufficient for bead members (described below) to be fitted in.

Below the cooling plate 4 and the base 11, an elevation mechanism 42 is provided which moves up and down the cooling plate 4, as shown in FIG. 6. The elevation mechanism 42 includes plural supporting pins 43 which can protrude upward and recede below through holes formed in the base 11 by the operations of the elevation mechanism 42. With this, the cooling plate 4 can be moved upward and downward in relation to the wires 51A, 51B, so that the wires 51A, 51B can be fitted in and get out from the corresponding grooves 41.

The heating chamber 3 is made of a highly heat conductive material such as aluminum, stainless steel, and the like, and has a U-shaped cross-section, as shown in FIG. 6, so as to provide the opening 31 through which the wafer W is transferred into the heating chamber 3 and slits 33 in the side walls of the heating chamber 3. The slits 33 allow the wires 51A, 51B to move therethrough. The height of the opening 31 (i.e., a distance from a bottom plate 35 to a top plate 34) is about 3 mm, in this embodiment. In addition, the heating chamber 3 has planer dimensions of, for example, 350 mm×370 mm when designed to heat a 12 inch wafer.

As shown in FIG. 6, heat plates 36, 37 made of aluminum nitride (AlN), silicon carbide (SiC), or the like are attached on the top surface of the top plate 34 and the back surface of the bottom plate 35, respectively. The heat plates 36, 37 are shaped into a circular plate having substantially the same diameter as the wafer W, for example, and have a thickness of about 2 mm. The heat plates 36, 37 may include a heater, or a resistance heater element, and heat the top plate 34 and the bottom plate 35, respectively, and thus the heating chamber 3. With this, the wafer W in the heating chamber 3 can be heated by the heat plates 36, 37 via the top plate 34 and the bottom plate 35.

Figure 10A:
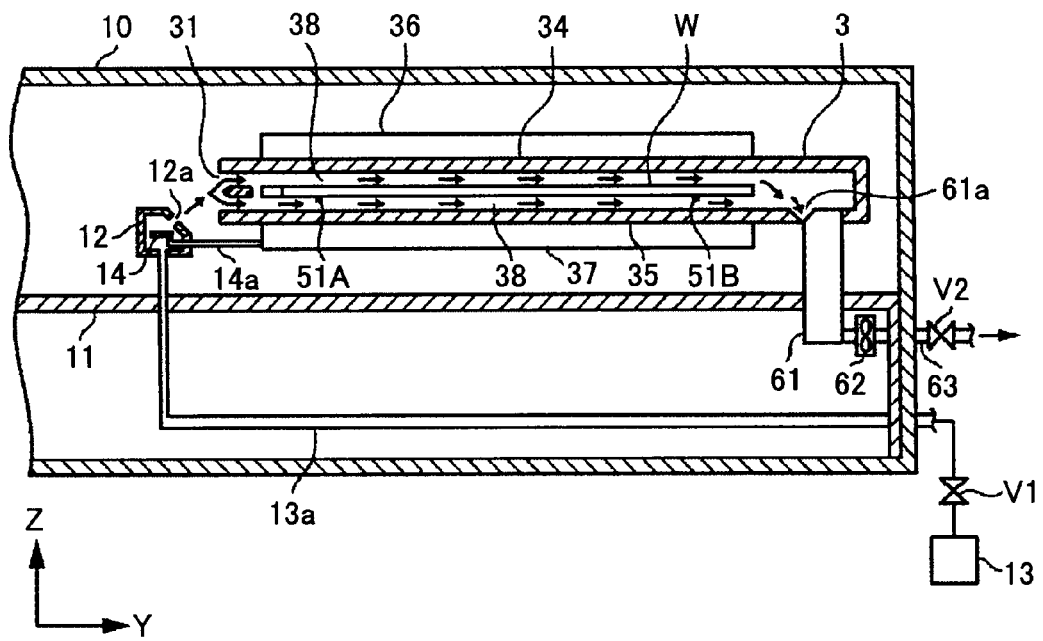
FIG. 10A is a cut-away diagram illustrating the spatial relationship between the wafer and the pressure loss adjustment plate.

Moreover, as shown in FIG. 6, a gas injection portion 12 is arranged on the base 11 and in front of the heating chamber 3, and a gas evacuation portion 61 is arranged in a rear portion of the heating chamber 3. The gas injection portion 12 and the gas evacuation portion 61 can create the gas stream in one direction in the heating chamber 3. The gas injection portion 12 has a slant plane (FIG. 10A) that is directed toward the opening 31 of the heating chamber 3, and plural injection holes 12a are formed in the slant plane at predetermined intervals from one end to the other of the slant plane, as shown in FIG. 5. The distance between one outermost injection hole 12a and the other outermost injection hole 12a is longer than or equal to the diameter of the wafer W. By the way, the gas injection portion 12 has inside a heat transfer plate 14 that is connected to the heat plate 37 via a heat pipe 14a, as shown in FIG. 10A. The heat transfer plate 14 heats the gas to be at the same temperature as the heating temperature and then the heated gas is supplied to the heating chamber 3. It is noted that the gas injection portion 12 is omitted in FIG. 4.

The gas injection portion 12 is connected to a gas supplying source 13 located outside of the heating apparatus 1 via a gas supplying pipe 13a and a valve V1, as shown in FIG. 10A. The gas supplying source 13 restores clean purge gas such as an inert gas and nitrogen gas.

On the other hand, the topmost portion of the gas evacuation portion 61 is inserted into a hole formed in a rear portion of the bottom plate 35 as shown in FIG. 10A, so that the heat plate 37 is sandwiched between the gas evacuation portion 61 and the gas injection portion 12. Similar to the gas injection portion 12, the gas evacuation portion 61 has a slant plane that is directed toward the wafer W in the heating chamber 3, as shown in FIG. 10A, and plural evacuation holes 61a are formed in the slant plane at predetermined intervals from one end to the other of the slant plane, as shown in FIG. 5. The distance between one outermost evacuation hole 61a and the other outermost evacuation hole 61a is longer than or equal to the diameter of the wafer W. In addition, the gas evacuation portion 61 is connected to an evacuation conduit provided in a fabrication plant via an evacuation pipe 63 having a fan 62 and a valve V2. An evacuation rate of the gas from the evacuation portion 61 may be adjusted by, for example, controlling a rotational speed of the fan 62 and an opening degree of the valve V2.

As shown in FIG. 6, the heating apparatus 1 includes a controlling portion 7 having a computer, for example. The controlling portion 7 controls various operations of the elevation mechanism 42, the gas supplying source 13, the fan 62, and the like. In order to control transferring the wafer W, a flow rate of the gas from the gas injection portion 12, and supplying timing, the controlling portion 7 reads out a computer program from a computer readable storage medium 4a so as to cause various components or elements to carry out various operations in accordance with the program. The computer readable storage medium 4a may be a portable hard disk, a CD-R, a CD-RW, DVD-R, DVD-RW, a magneto-optical disk, a memory card, a USB memory and the like.

In the heating apparatus 1, if configured as stated so far, it may be difficult for the gas supplied from the gas injection portion 13 to flow at the same flow speed throughout in the entire heating chamber 3. However, the heating apparatus 1 according to this embodiment includes a pressure loss adjustment plate 2 so as to even out the flow speed of the gas in the heating chamber 3.

Figure 7:
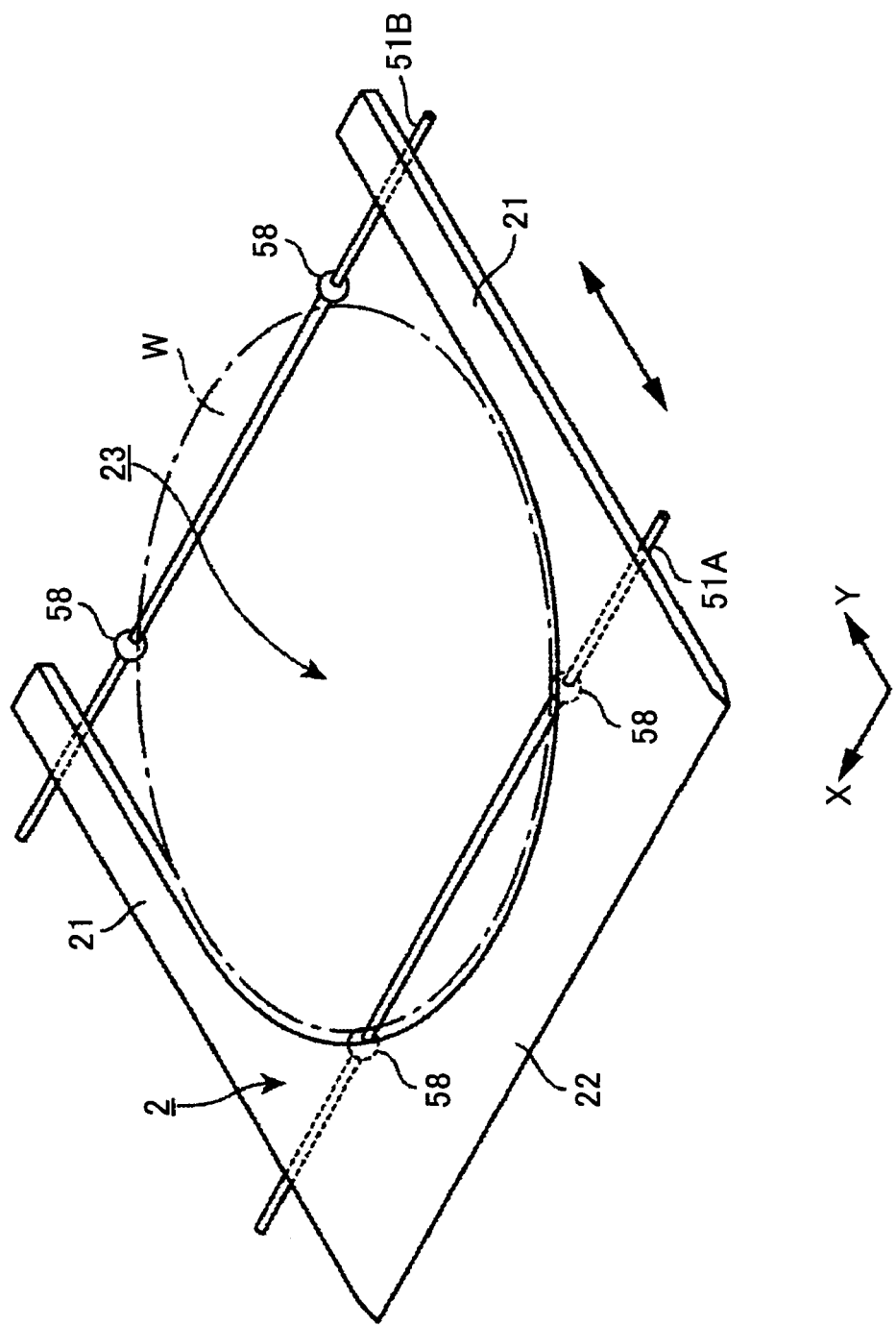
FIG. 7 is a perspective view of a pressure loss adjustment plate in the heating apparatus shown in FIG. 4.

Referring to FIG. 7, the pressure loss adjustment plate 2 includes arm portions 21 that extend in parallel with each other in the Y direction, and a connection portion 22 that connects the two arm portions 21. With this configuration, a U-shaped opened out portion 23 is formed in the pressure loss adjustment plate 2. The pressure loss adjustment plate 2 is made of, for example, ceramics or the like having a low thermal capacity. The pressure loss adjustment plate 2 has a thickness of, for example, 0.8 mm, which is substantially the same as the thickness of the wafer W, and lengths in the X and Y directions are determined so that the pressure loss adjustment plate 2 can be transferred into the heating chamber 3 while being kept horizontal. In addition, the connection portion 22 becomes thinner toward the front end, or along the negative Y direction, as shown in FIG. 7.

The pressure loss adjustment plate 2 is attached on the wires 51A, 51B so that the opened out portion 23 is directed toward the heating chamber 3, as shown in FIGS. 4 and 5. The opened out portion 23 has a dimension that allows the wafer W and the cooling plate 4 to go through the opened out portion 23, leaving a gap of, for example, 2 mm in relation to the arm portions 21 and the connection portion 22, as shown in FIG. 7. By the way, as shown in FIG. 7, each of the wires 51A, 51B has two beads members 58 that position the wafer W. It is noted that the beads members 58 are omitted in the other drawings.

Figure 8:
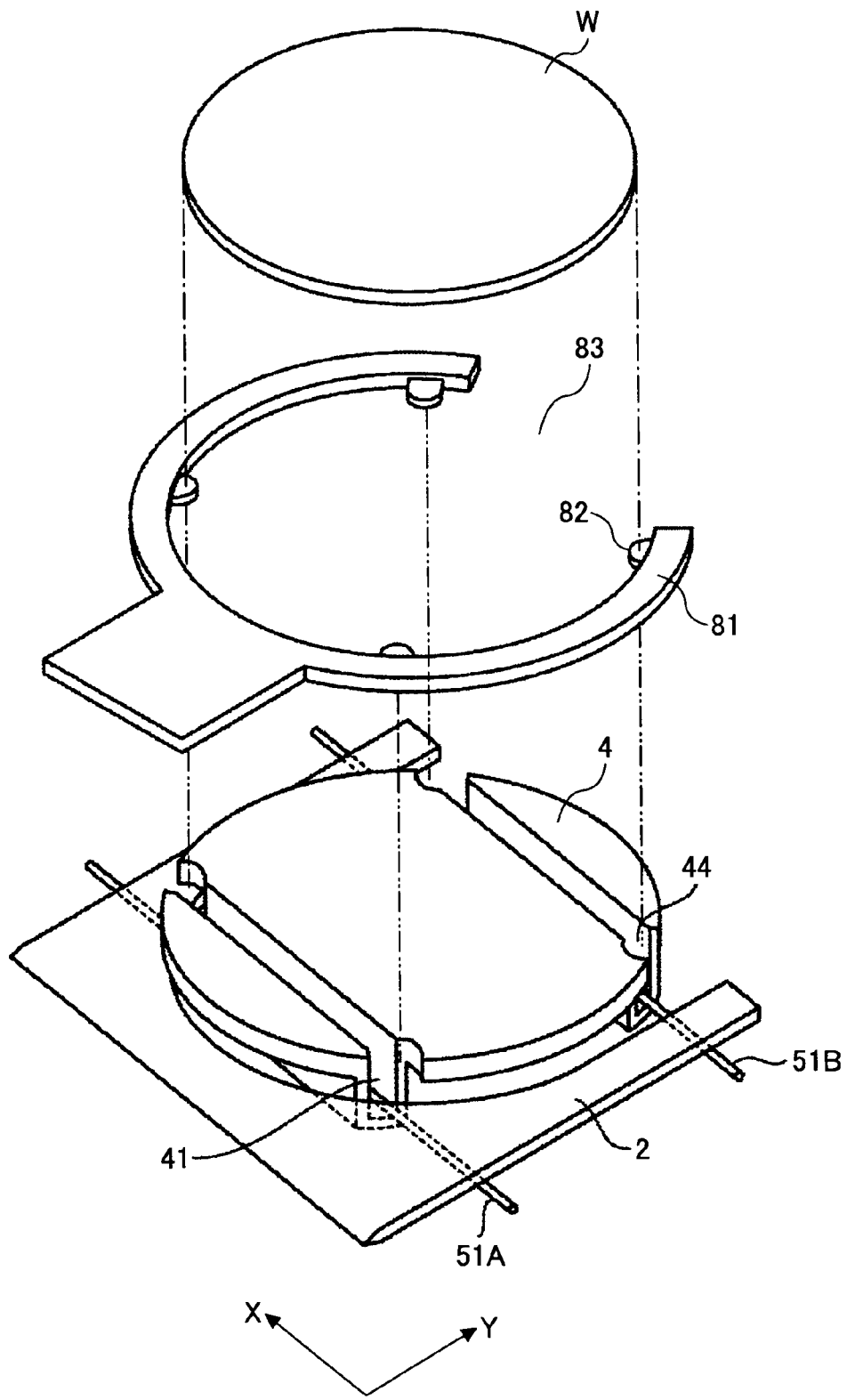
FIG. 8 is a perspective view of an arm portion of a transfer mechanism outside of the heating apparatus shown in FIG. 4, and a cooling plate and the pressure loss adjustment plate of the heating apparatus shown in FIG. 4.

Next, operations for the wafer W to be transferred onto the wires 51A, 51B are explained in reference to FIG. 8. The wafer transfer mechanism outside of the heating apparatus 1 has a horseshoe shaped transfer arm 81 that has supporting projections 82 that project inward. With this, the wafer W on which a resist solution is coated is supported by the supporting projections 82 and transferred into the process container 10 through the transfer opening 10a by the transfer arm 81, so that the wafer W reaches above the cooling plate 4. At this time, the cooling plate 4 is raised by the elevation mechanism 42 and the wires 51A, 51B are brought down in relation to the cooling plate 4 into the grooves 41. Therefore, the pressure loss adjustment plate 2, which is fixed on the wires 51A, 51B, is positioned below the top surface of the cooling plate 4.

Next, the transfer arm 81 begins to be lowered. Since the transfer arm 81 has an inner diameter sufficiently larger than the diameter of the cooling plate 4, the transfer arm 81 can go down below the top surface of the cooling plate 4 without touching the cooling plate 4, so that the wafer W is now placed on the top surface of the cooling plate 4. By the way, the cooling plate 4 has cutout portions 44 that correspond to the projections 82 of the transfer arm 81, which allow the projections 82 to go through the cutout portions 44. Then, the transfer arm 81 is further lowered to a position between the cooling plate 4 and the pressure loss adjustment plate 2, and moves in the negative Y direction so as to withdraw from the process container 10 of the heating apparatus 1.

After the above operations are completed, the elevation mechanism 42 brings the cooling plate 4 down, so that the wires 51A, 51B and the pressure loss adjustment plate 2 are raised in relation to the cooling plate 4. Therefore, the wires 51A, 51B can receive the wafer W, as shown in FIGS. 4 and 7. At this time, the wafer W is supported by the wires 51A, 51B so as to be within the opened out portion 23 of the pressure loss adjustment plate 2. Then, when the driving mechanism 53 is activated, the wafer W is transferred along with the pressure loss adjustment plate 2 into the heating chamber 3.

Figure 9:
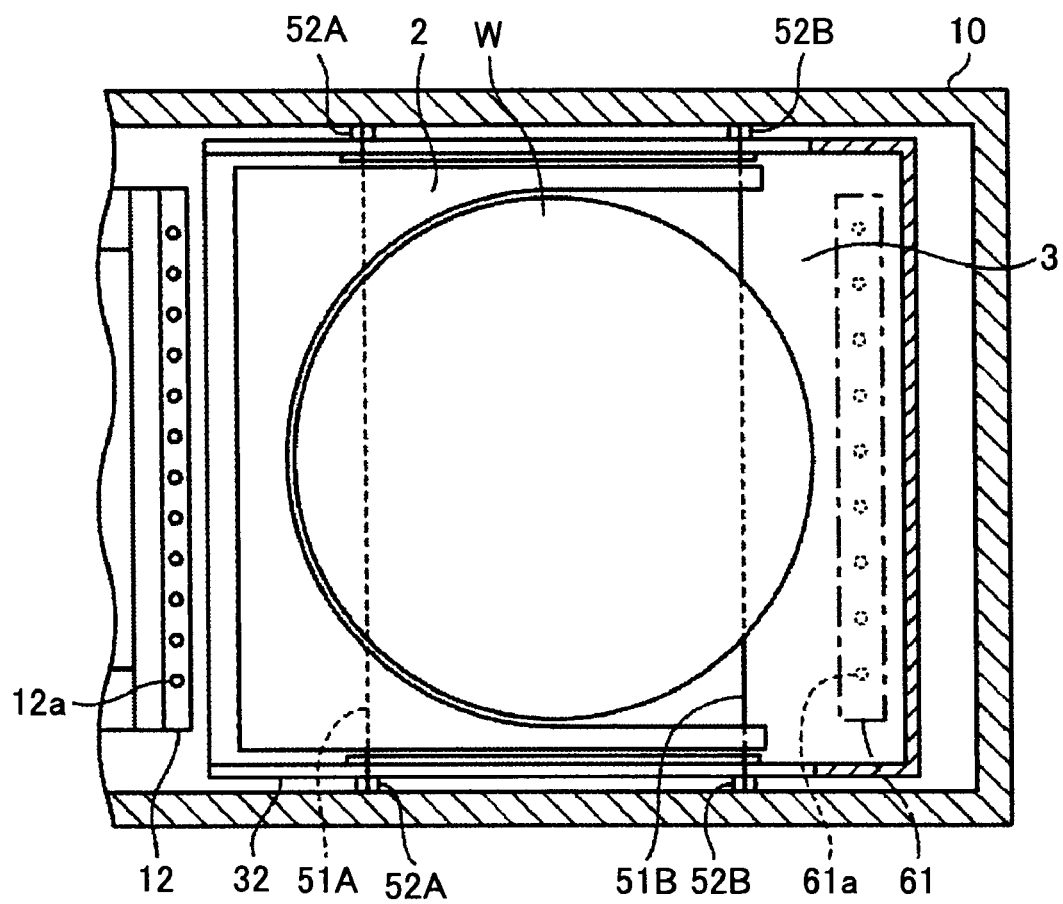
FIG. 9 is a plan view illustrating a spatial relationship between a wafer transferred in a heating chamber of the heating apparatus in FIG. 4 and the pressure loss adjustment plate shown in FIG. 7.
Figure 10B:
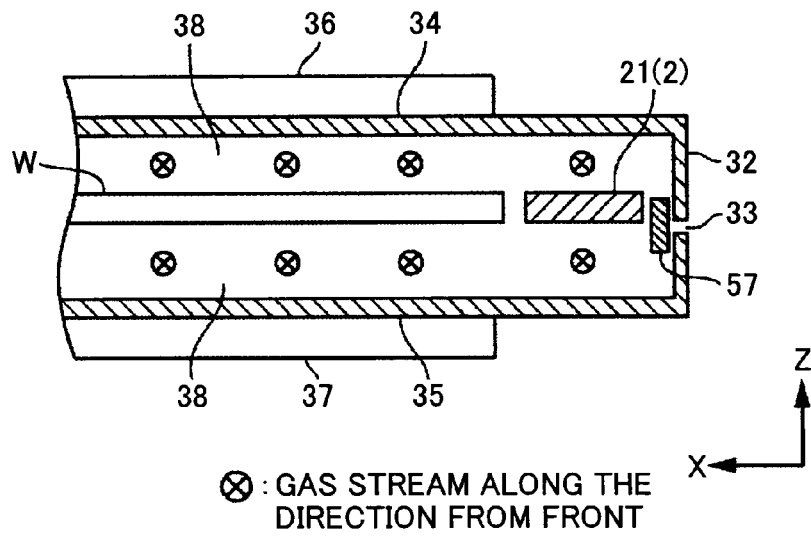
FIG. 10B is another cut-away diagram illustrating the spatial relationship between the wafer and the pressure loss adjustment plate.

Prior to explaining the heating process in the heating apparatus 1, a positional relationship between the wafer W and the pressure loss adjustment plate 2 in the heating chamber 3 is described in reference to FIGS. 9, 10A, and 10B. The wafer W in the heating chamber 3 is still supported by the wires 51A, 51B so as to be positioned in between and substantially in parallel with the top plate 34 and the bottom plate 35, as shown in FIG. 10A. When the gas is supplied into the heating chamber 3 from the gas injection portion 12, one-directional gas stream passages 38 are created between the top plate 34 and the top surface of the wafer W, and between the bottom plate 35 and the back surface of the wafer W, respectively.

On the other hand, one of the arm portions 21 of the pressure loss adjustment plate 2 occupies the space between the wafer W and one of the side walls 32 of the heating chamber 3, and the other of the arm portions 21 of the pressure loss adjustment plate 2 occupies the space between the wafer W and the of the side walls 32 of the heating chamber 3. In addition, the top surfaces of the arm portions 21 are at the same level as the top surface of the wafer W. Moreover, the connection portion 22 of the pressure loss adjustment plate 2 is positioned in the negative Y direction in relation to the wafer W, with the top surface of the connection portion 22 at the same level as the top surface of the wafer W. In other words, the connection portion 22 is positioned so that the gas supplied into the heating chamber 3 from the gas injection portion 12 first encounters the connection portion 22.

Next, functions of the pressure loss adjustment plate 2 during the heating process in the heating apparatus 1 are described. When the wafer W is transferred into the heating chamber 3, the heating chamber 3 is heated, for example, at about 130° C. by the heat plates 36, 37. After the wafer W is transferred, the valve V1 is opened so as to supply the gas, which is heated to about 130° C., into the heating chamber 3 from the gas injection portion 12, and the fan 62 is turned on so as to evacuate the gas from the heating chamber 3. With these operations, the gas flows in one direction along the gas stream passages 38 above and below the wafer W, as shown in FIGS. 10A and 10B. In this situation, the resist solution coated on the wafer W is heated by heat radiation from the heat plates 36, 37 and heat convection by the gas. Thus, solvents or volatile substances in the resist solution are evaporated into the atmosphere in the heating chamber 3 and evacuated out from the heating chamber 3 through the evacuation portion 61 by the gas flowing along the gas stream passages 38.

During such a heating process, the arm portions 21 of the pressure loss adjustment plate 2 are positioned in the spaces between the wafer W and the side walls 32 of the heating chamber 3, and serve as impediments that increase the pressure loss (pneumatic resistance) so as to impede the gas flowing toward these spaces. Therefore, the gas is prevented from being converged into the spaces, thereby improving the gas flow speed uniformity in the heating chamber 3, compared to when the pressure loss adjustment plate 2 is not provided.

Specifically, since the pressure loss adjustment plate 2 has the same thickness as the wafer W and the top surface of the pressure loss adjustment plate 2 is positioned at the same level as the top surface of the wafer W in this embodiment, the gas stream passages 38 above and below the wafer W are extended substantially from one of the side walls 32 of the heating chamber 3 to the other while keeping substantially equal height, as shown in FIG. 10B. Therefore, the pressure loss adjustment plate 2 does not bring about side effects that may increase the pneumatic resistance too much so as to decrease the gas flow speed above and below the arm portions 21 or to cause turbulence in the gas chamber 3.

Figure 2A:
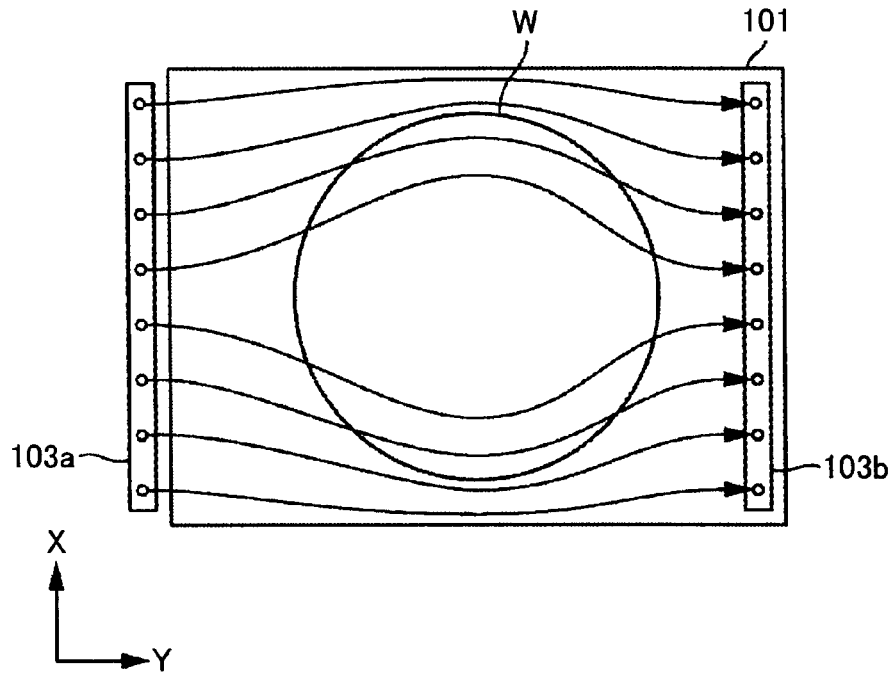
FIGS. 2A and 2B are plan views representing gas flow patterns in the heating chamber of the related art heating apparatus.
Figure 2B:
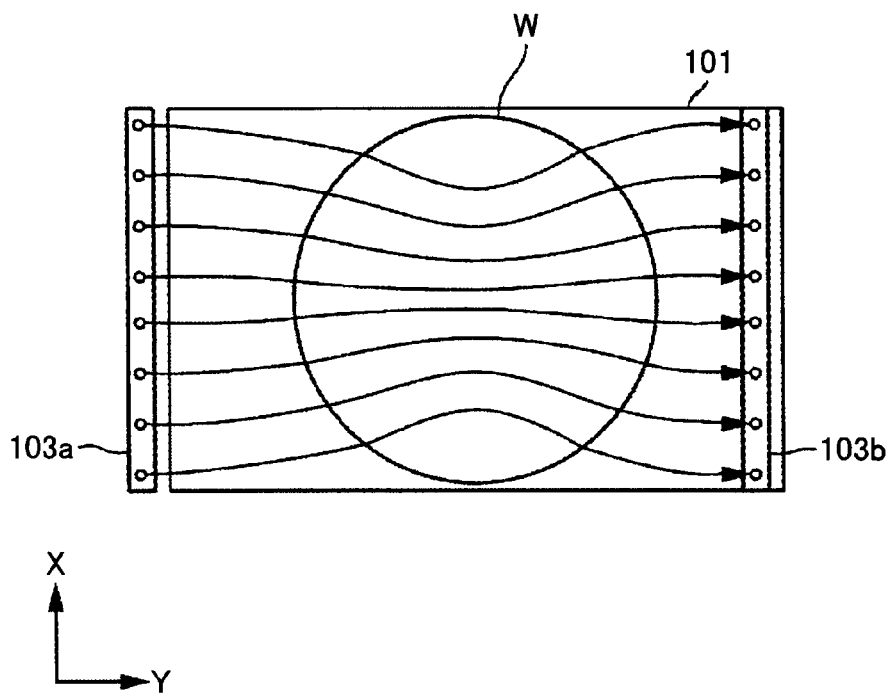
Figure 3A:
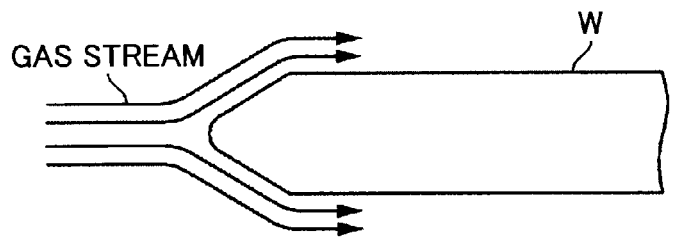
FIG. 3A illustrates a bevel portion of a wafer edge and a gas flow pattern of gas hitting the bevel portion.
Figure 3B:
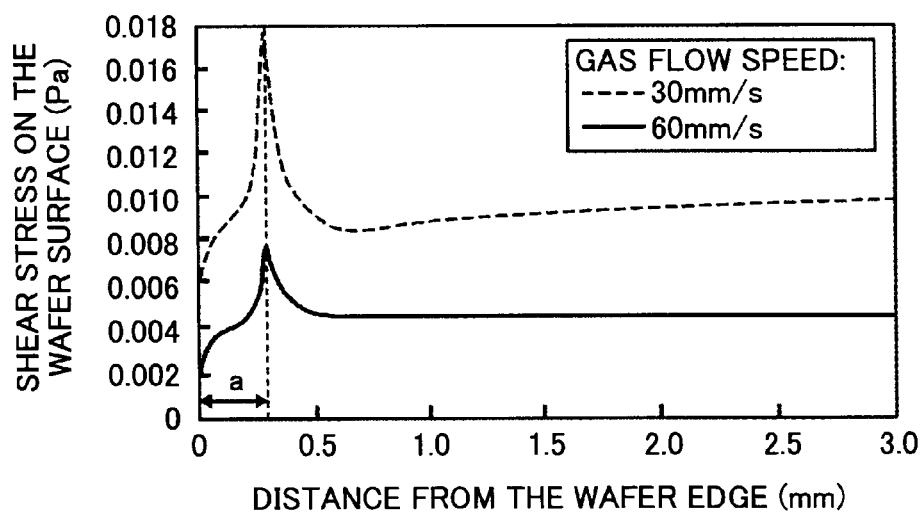
FIG. 3B is a graph illustrating simulation results of shear stress applied on a wafer surface by the gas flowing along the gas flow pattern shown in FIG. 3A.
Figure 3C:
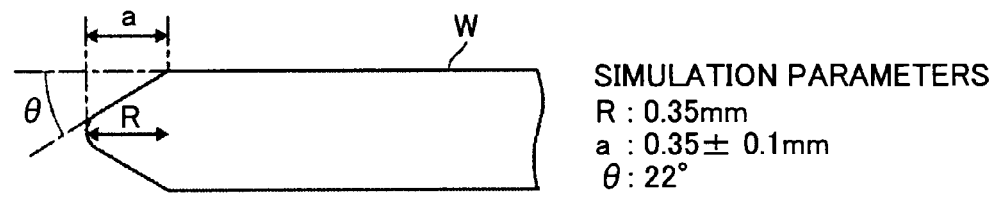
FIG. 3C illustrates simulation parameters used in the simulation whose results are shown in FIG. 3B.

In addition, since the arm portions 21 of the pressure loss adjustment plate 2 are positioned at the spaces between the wafer W and the side walls 32 of the heating chamber 3 in the above-stated manner, the influence placed on the gas from the side walls 32, which has been described in reference to FIG. 2B, can be reduced. As a result, the pressure loss adjustment plate 2 can eliminate the situation in which the gas flows faster in the middle portion of the wafer W and lower near the side walls 32, thereby improving the temperature uniformity over the wafer W.

Moreover, since the connection portion 22 of the pressure loss adjustment plate 2 is positioned in front of the wafer W in the gas stream direction as shown in FIGS. 9 and 10A, the gas supplied from the gas injection portion 12 into the heating chamber 3 can be prevented from directly hitting the bevel portion of the wafer W, thereby reducing the shear stress applied on the bevel portion. Furthermore, since the connection portion 22 has a wedged end against the gas stream direction, the gas from the gas injection portion 12 can be smoothly divided toward the upper and lower gas stream passages 38. As a result, gas turbulence can be prevented at the wedged end of the connection portion 22, thereby contributing to the improvement in the temperature uniformity over the wafer W.

After heating the wafer W as explained above is carried out for a predetermined period of time, the valve V1 is closed so as to stop supplying the gas from the gas injection portion 12, and the fan 62 is turned off so as to stop evacuating the gas from the heating chamber 3, thereby completing the heating process. Then, the wafer W is transferred out from the heating chamber 3 to the position above the cooling plate 4 in such a manner opposite to when the wafer W is transferred in. Next, the cooling plate 4 is raised so as to receive the wafer W from the wires 51A, 51B. The wafer W is cooled by the cooling plate 4 to a temperature that can be readily handled in subsequent processes, and transferred from the heating apparatus 1.

As stated above, the arm portions 21 of the pressure loss adjustment plate 2 are positioned on both sides of the wafer W in the heating apparatus 1 according to this embodiment of the present invention, thereby improving the gas flow speed uniformity in the heating chamber 3. Therefore, the wafer W can be uniformly heated when the heating process is carried out so as to heat the wafer W and the resist solution coated on the wafer W. As a result, solvents or volatile substances are uniformly evaporated from the resist solution, and thus a resist film after the heating process has uniform properties over the wafer W, thereby preventing production yield reduction. In addition, because of the pressure loss adjustment plate 2, the gas flow speed can be uniform even when the heating chamber 3 is flattened. Therefore, the heating apparatus 1 can be downsized.

In addition, since the connection portion 22 of the pressure loss adjustment plate 2 is positioned in front of the wafer W in the gas stream direction, the shear stress applied by the gas on the bevel portion of the wafer W can be alleviated. Therefore, the resist solution coated on the bevel portion is not revealed, and particles, which may exist on the bevel portion, are not removed by the gas hitting the bevel portion, thereby improving the production yield. Moreover, the wedged end of the connection portion 22 can prevent the turbulence in the heating chamber 3, which contributes to an improvement in the temperature uniformity over the wafer W.

The arm portions 21 of the pressure loss adjustment plate 2 are especially effective when a distance between the top plate 34 and the bottom plate 35 (the height of the heating chamber 3) is small, for example, as small as 5 mm or less. If the distance is larger, the gas stream passages created between the top plate 34 and the bottom plate 35 are also larger, and thus such gas stream passages provide a larger air conductance not only near the side walls 32 but also above the wafer W. Therefore, the gas flow speed tends to be substantially constant throughout the gas stream passages. However, when the height of the gas stream passages becomes smaller, the gas stream passages provide a larger conductance in the spaces between the side walls 32 and the wafer W, and a lower conductance above the wafer W, if the pressure loss adjustment plate 2 is not employed. As a result, the gas tends to be directed toward the spaces between the side walls 32 and the wafer W.

In addition, when the gas stream passages have a larger height, a larger amount of gas can flow through the gas stream passages. In this case, gas turbulence caused at the front end of the wafer W does not have a strong influence on the gas stream as a whole. However, such gas turbulence has rather greater influence on the gas stream, especially near the top surface of the wafer W when the gas stream passages have a smaller height. According to the heating apparatus 1 of this embodiment of the present invention, the influence due to the gas turbulence can be reduced since the connection portion 22 of the pressure loss adjustment plate 2 can divide the gas supplied from the gas injection portion 12 without causing gas turbulence, even when the heating chamber 3 has a lower height of, for example, 5 mm or less.

Figure 11A:
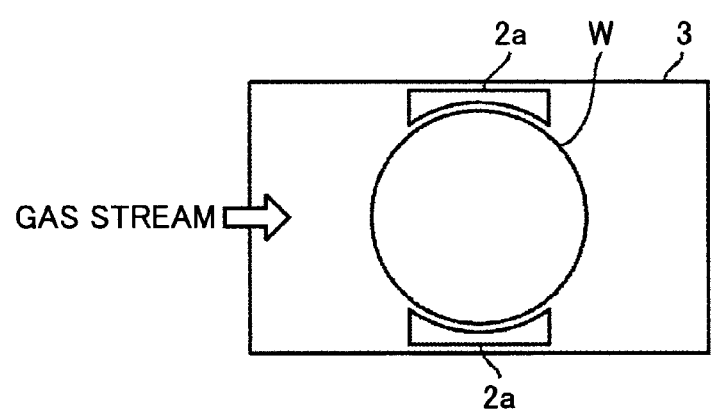
FIGS. 11A through 11D are plan views illustrating various alteration examples of the pressure loss adjustment plate.
Figure 11B:
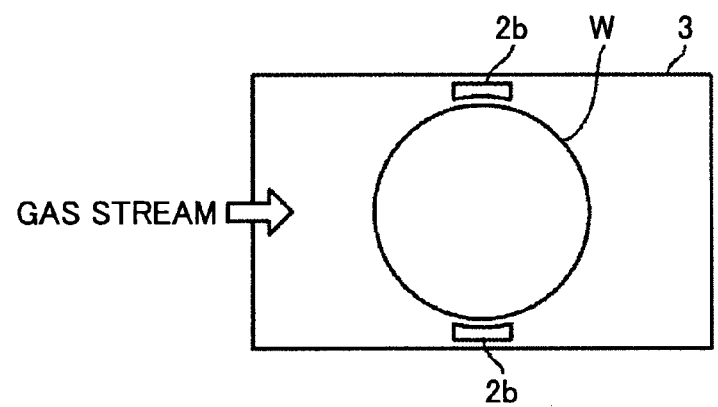
Figure 11C:
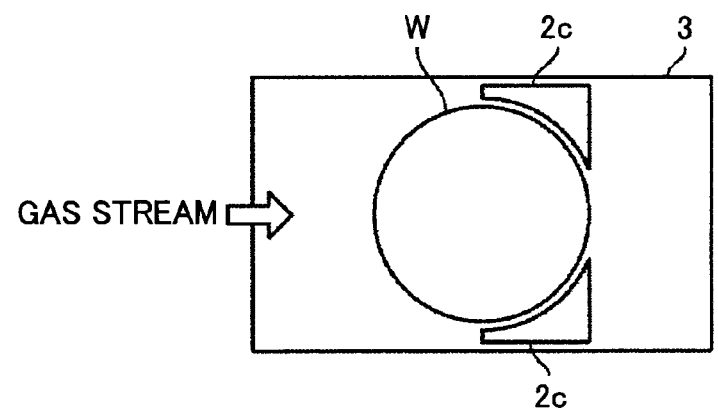
Figure 11D:
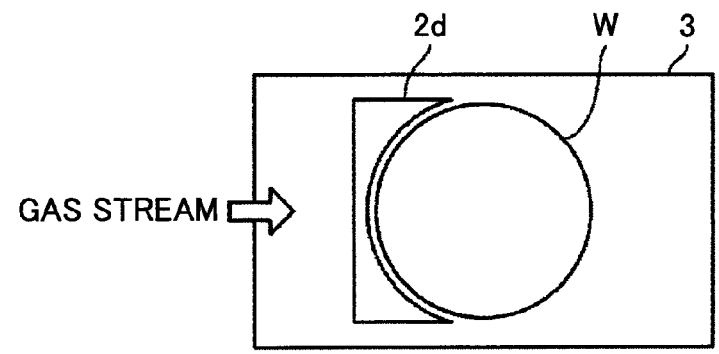

The pressure loss adjustment plate 2 may be modified, for example, as shown in FIGS. 11A through 11D. Referring to FIG. 11A, one of two pressure loss adjustment plates 2a is positioned between the wafer W and one side wall of the heating chamber 3, and the other of the pressure loss adjustment plates 2a is positioned between the wafer W and the other side wall of the heating chamber 3. In addition, the pressure loss adjustment plates 2a may be shorter as shown in FIG. 11B as pressure loss adjustment plates 2b. Moreover, referring to FIG. 11C, one of two pressure loss adjustment plates 2c is positioned between one side rear portion of the wafer W and one side wall of the heating chamber 3, the other of two pressure loss adjustment plates 2c is positioned between the other side rear portion of the wafer W and the other side wall of the heating chamber 3. Furthermore, the pressure loss adjustment plate 2 can be modified in contrast to these pressure loss adjustment plates 2a, 2b, 2c. A pressure loss adjustment plate 2d shown in FIG. 11D has only a portion corresponding to the connection portion 22 of the pressure loss adjustment portion 2 and lacks portions corresponding to the arm portions 21.

Figure 12:
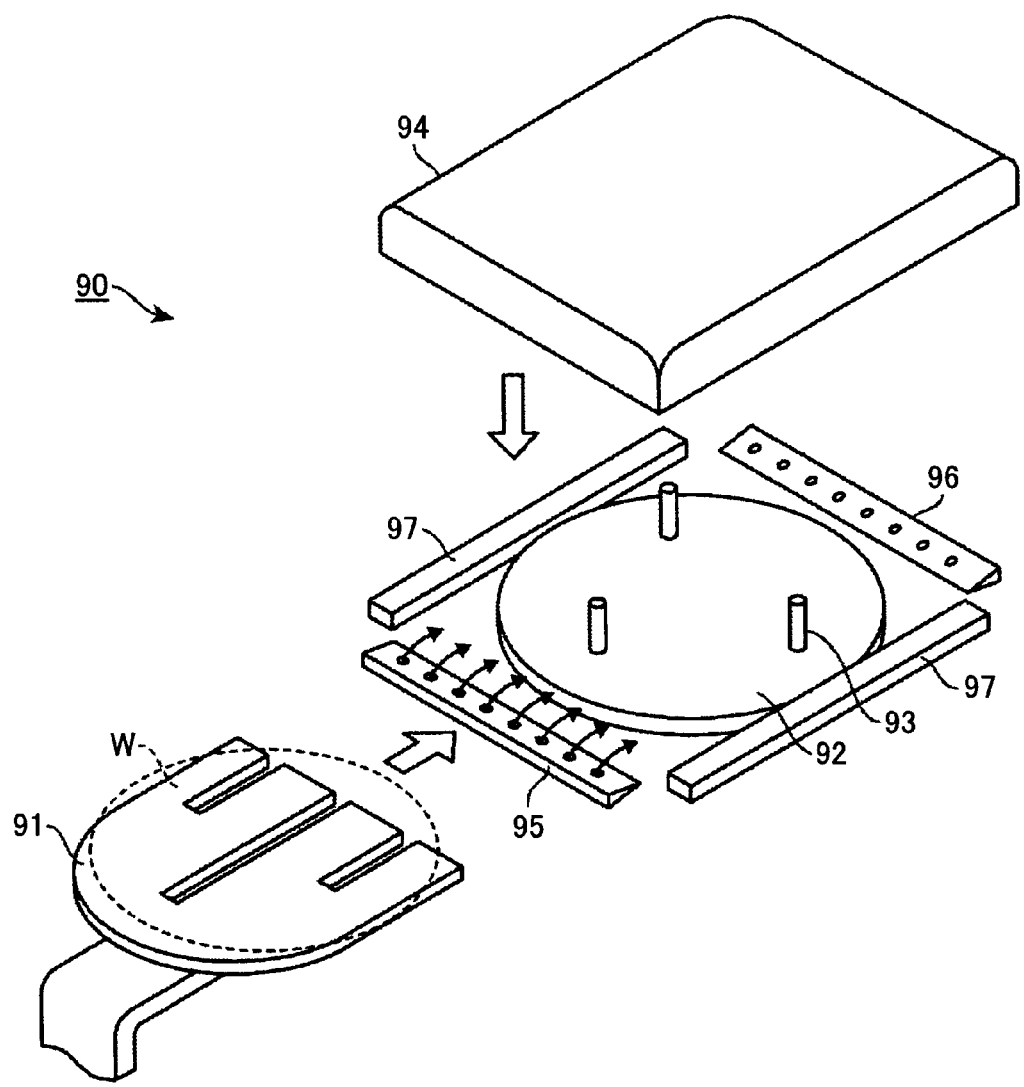
FIG. 12 is an exploded perspective view of a primary portion of a heating apparatus according to another embodiment of the present invention.

In addition, the pressure loss adjustment plates 2, 2a, 2b, 2c 2d are employed not only in the heating apparatus 1 according to this embodiment but also in various other types of heating apparatuses, an example of which is illustrated in FIG. 12. As shown, a heating apparatus 90 includes a heat plate 92 having supporting pins 93, a gas injection portion 95, a gas evacuation portion 96, a cooling plate 91 that can cool and transfer the wafer W, and an upper cover 94. In the heating apparatus 90, the wafer W is transferred to a position above the heat plate 92 by the cooling plate 91, received by the supporting pins 93, and placed directly on the heat plate 92 by the supporting pins 93 after the cooling plate 91 is returned. After the upper cover 94 is lowered to cover the wafer W, gas is supplied from the gas injection portion 95 and evacuated from the gas evacuation portion 96, which creates the gas stream in one direction in the heating apparatus 90. In such a manner, the wafer W is heated through heat transfer from the heat plate 92.

The heating apparatus 90 also includes pressure loss adjustment plates 97 that extend along the gas stream direction and flank the heat plate 92. The pressure loss adjustment plates 97 are positioned so that the top surfaces of the pressure loss adjustment plates 97 are substantially the same level as the top surface of the wafer W placed on the heat plate 92. Therefore, the pressure loss adjustment plates 97 can demonstrate the same effects as the pressure loss adjustment plates described above. Although not shown, the pressure loss adjustments plates 97 may be connected at their front portions by a connection portion, similar to the pressure loss adjustment plates 2. By the way, after the wafer W is thermally heated on the heat plate 92, the wafer W is transferred back to the cooling arm 91 from the heat plate 92, cooled to a temperature that can be readily handled in subsequent processes, and transferred out from the heating apparatus 90.

Figure 13:
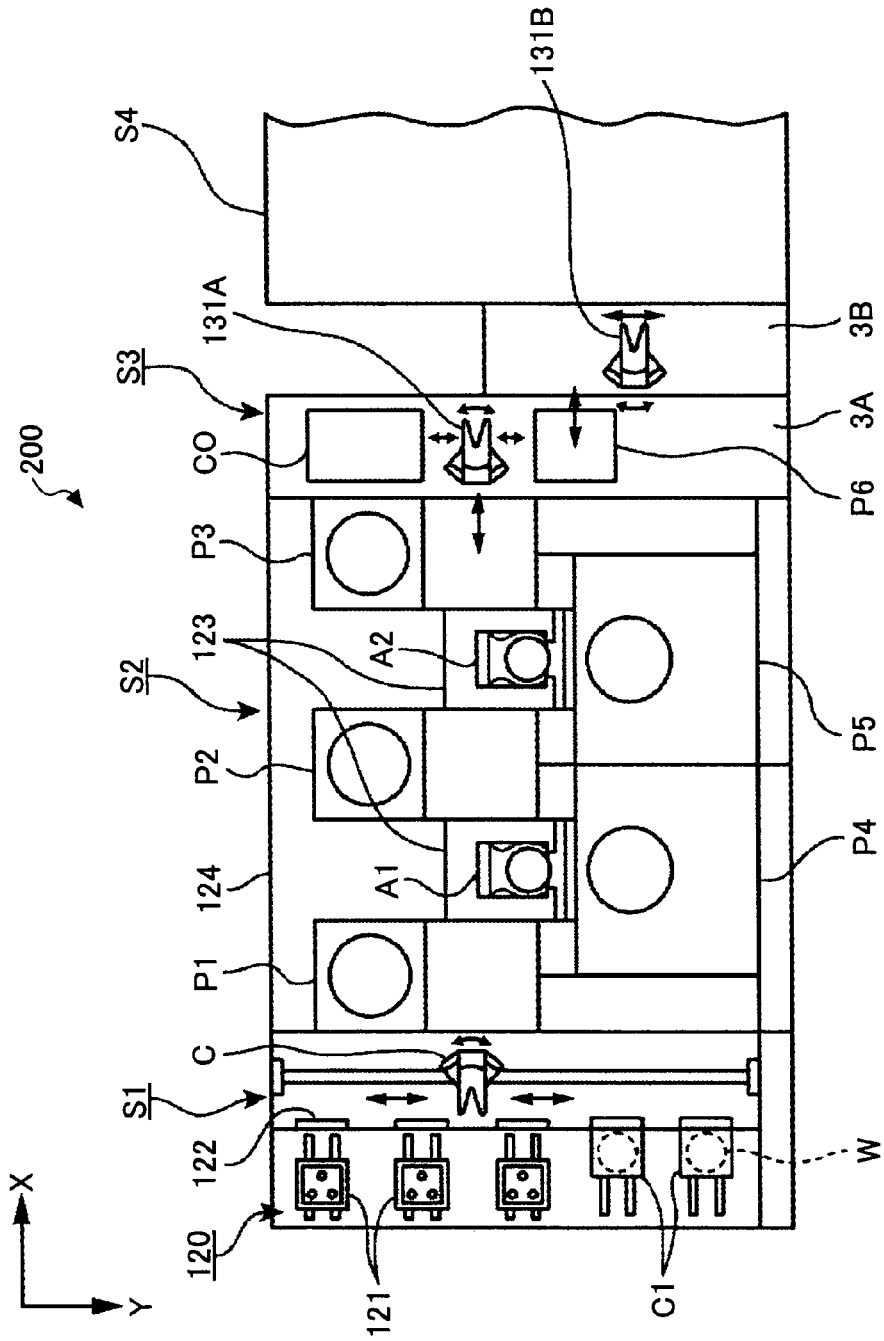
FIG. 13 a plan view of a coater/developer to which a heating apparatus according to an embodiment of the present invention is applied.
Figure 14:
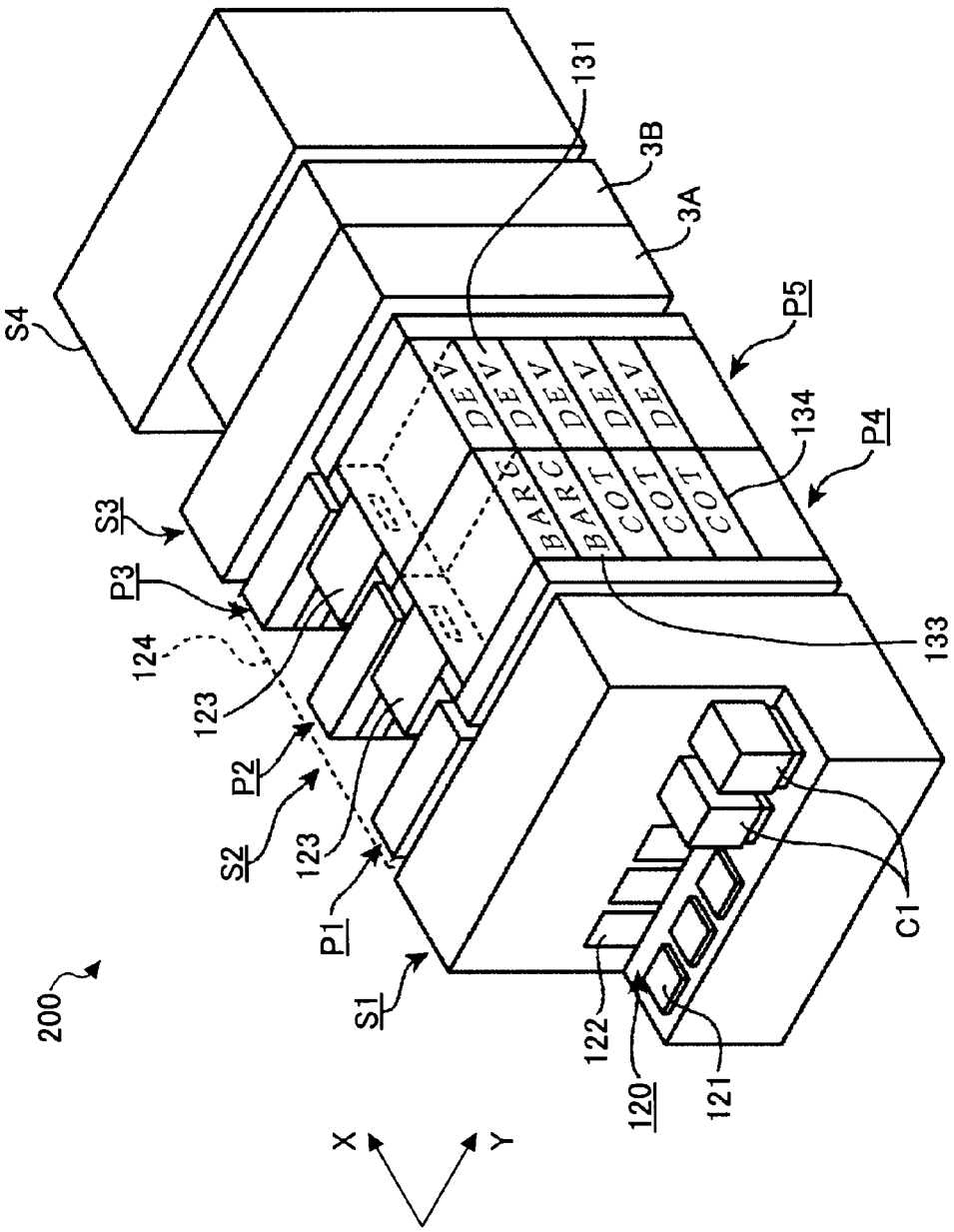
FIG. 14 is a perspective view of the coater/developer shown in FIG. 13.

Next, a coater/developer to which the heating apparatus 1 (90) is applied is described in reference to FIGS. 13 and 14. FIG. 13 is a plan view of a coater/developer to which an exposure apparatus is combined. FIG. 14 is a perspective view of the coater/developer with the exposure apparatus shown in FIG. 13. As shown in the drawings, a coater/developer 200 includes a carrier block S1 composed of a carrier station 120, doors 122, and a transfer arm C. The carrier station 120 has stages 121 on which carriers C1 are placed. The carrier C1 can house, for example, 13 wafers in a hermetical manner. The doors 122 are positioned on a front wall of the carrier block S1 so as to correspond to the stages 121.

The wafer W in one of the carriers C1 is brought out by the transfer arm C through the corresponding door 122.

Behind the carrier block S1, a process block S2 that is enclosed by a chassis 124 is coupled to the carrier block S1. The process block S2 includes a shelf unit P1, a liquid treatment unit P4, a shelf unit P2, a liquid treatment unit P4, and a shelf unit P3 in this order in a staggered manner along a Y direction in FIG. 13. A transfer mechanism A1 is located in a space 123 defined by the two shelf units P1, P2 and the liquid treatment unit P4. The transfer mechanism A1 transfers the wafer W between the units P1, P2, and P4. In addition, a transfer mechanism A2 is located in another space 123 defined by the two shelf units P2, P3 and the liquid treatment unit P5. The transfer mechanism A2 transfers the wafer W between the units P2, P3, and P5.

The shelf units P1, P2, and P3 have multi-stage heating/cooling units in which pre-treatments or post-treatments are performed on the wafer W that is to be or has been processed in the liquid treatment units P4, P5. The multi-stage units may include the heating apparatus 1 (90) according to the embodiments of the present invention and cooling apparatuses.

In addition, the liquid treatment units P4, P5 have multi-stage (i.e., five-stage) units including a bottom anti-reflection film coating unit 133, a resist coating unit 134, a developing unit 131 that supplies a developer solution onto the wafer W so as to develop the resist film, or the like above a housing portion that houses chemical agents to be used in the units 131, 133, 134, such as a resist solution of chemical sensitization type and the developer solution.

Referring to FIGS. 13 and 14, an interface block S3 is located between the process block S2 and an exposure apparatus S4 and includes a first transfer chamber 3A and a second transfer chamber 3B. The first transfer chamber 3A has a wafer transfer mechanism 131A, which is pivotable and movable in both horizontal and vertical directions, and the second transfer chamber 3B has a wafer transfer mechanism 131B, which is pivotable and movable in both horizontal and vertical directions.

In addition, the first transfer chamber 3A is provided with a shelf unit P6 and a buffer cassette CO. The shelf unit P6 includes a transfer stage (TRS) for transferring the wafer W between the wafer transfer mechanisms 131A and 131B, a temperature control unit for adjusting the temperature of the wafer W to be sent to the exposure apparatus S4, and the like, which are stacked one above another.

In the coater/developer, the wafer W is transferred in the following manner. First, the carrier C1 housing the wafer W is placed on the stage 121 of the carrier block S1. Then, the wafer W is transferred from the carrier C1 to the exposure apparatus S4 via the transfer arm C, the transfer unit (TRS) of the shelf unit P1, the transfer mechanism A1, the bottom anti-reflection film coating unit (BARC) 133, the transfer mechanism A1, the resist coating unit (COT) 134, the transfer mechanism A1, the heating apparatus (PAB) 1, the transfer mechanism A1, the cooling unit, the transfer mechanism A2, the transfer unit (TRS) of the shelf unit P3, the wafer transfer mechanism 131A, the transfer unit (TRS) of the shelf unit P6, the temperature control unit of the shelf unit P6, and the wafer transfer mechanism 131B in this order.

After the wafer W is exposed in the exposure apparatus S4, the wafer W is transferred from the exposure apparatus S4 back to the carrier C1 via the wafer transfer mechanism 131B, the transfer stage (TRS) of the shelf unit P6, the wafer transfer mechanism 131A, the transfer unit (TRS) of the shelf unit P3, the heating apparatus 1 (PEB), the transfer mechanism A2, the developing unit 131, the transfer mechanism A2, the heating apparatus 1 (POST), the transfer mechanism A1, the transfer unit (TRS) of the shelf unit P1, and the transfer arm C in this order. With this, the photolithography process is completed for one of the wafers W housed in the carrier C1.

While the heating process performed on the semiconductor wafer has been described so far, the heating apparatus according to embodiments of the present invention may be employed so as to heat other substrates such as a glass substrate for use in fabricating a flat panel display (FPD) and a mask substrate for use in the exposure apparatus.

EXAMPLE

In order to confirm the effects demonstrated by the heating apparatus 1 according to the embodiment of the present invention, simulation experiments have been carried out. Simulation parameters and results are explained in the following.
Simulation 1

Figure 15A:
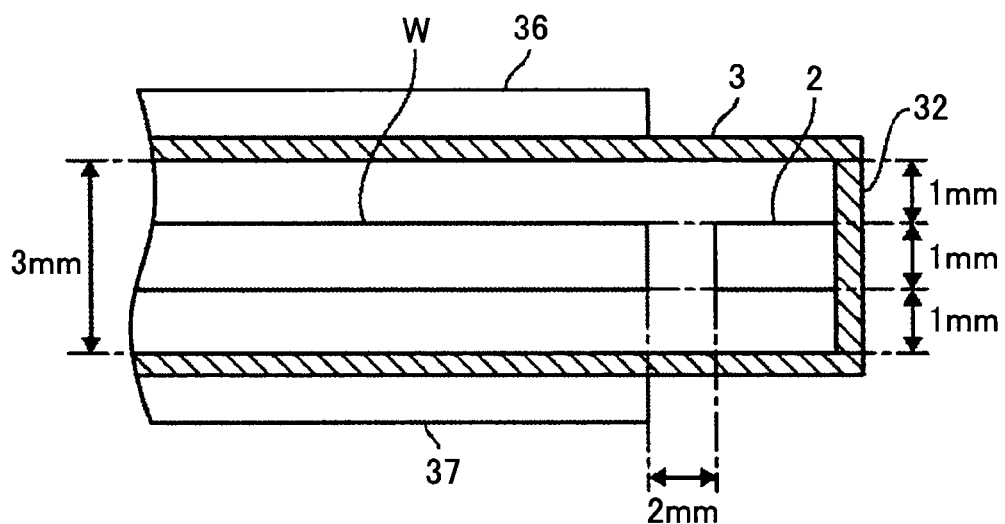
FIGS. 15A and 15B are cut-away diagrams illustrating parameters used in simulation for the heating apparatuses.

As shown in FIG. 15A, it is assumed as a model for the simulation that the heating chamber 3 has an inner height of 3 mm, and the wafer W having a thickness of 1 mm is placed in parallel with and 1 mm above the bottom plate of the heating chamber 3. Next to the wafer W, the pressure loss adjustment plate 2 having the same thickness as the wafer W is placed at the same level as the wafer W. In addition, the distance between the edge of the wafer W and an inner edge of the pressure loss adjustment plate 2 is 2 mm.
Simulation 2

Figure 15B:
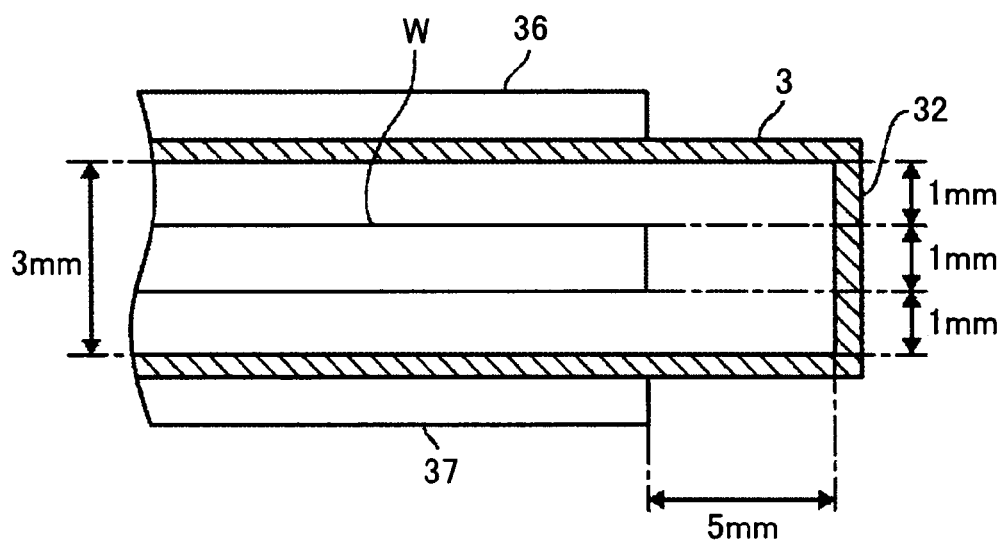
Figure 16A:
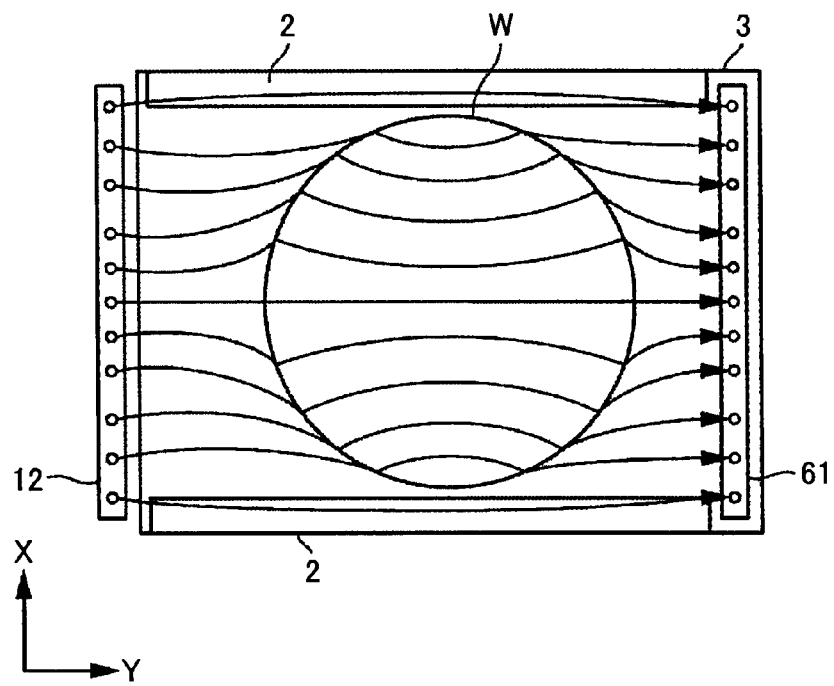
FIG. 16A is a plan view illustrating a simulation result obtained for the heating apparatus according to the embodiment of the present invention.
Figure 16B:
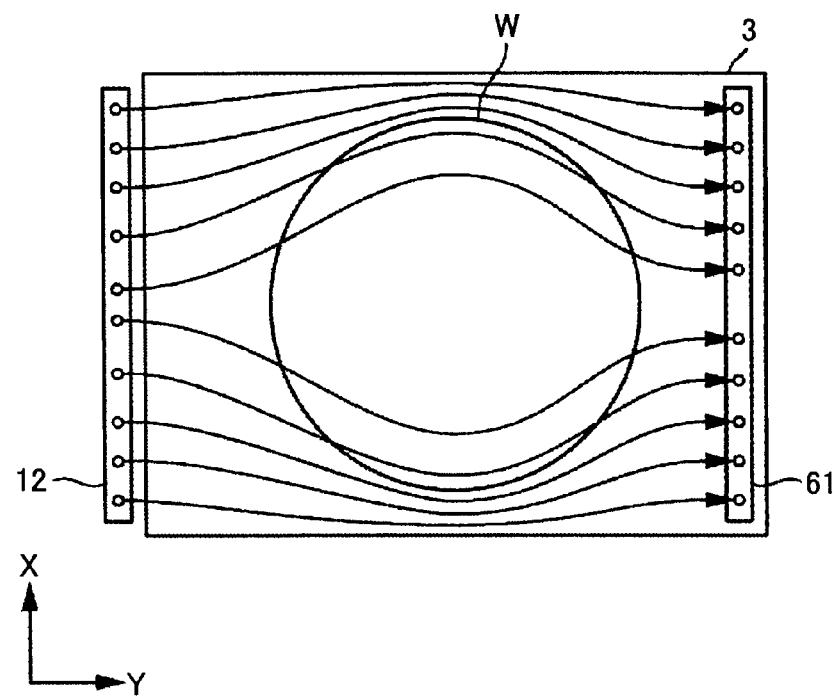
FIG. 16B is a plan view illustrating a simulation result obtained for a heating apparatus according to a comparative example.

The heating chamber 3 shown in FIG. 15B is assumed as a comparative model for the simulation. This model is basically the same as the model used in the simulation 1, except for lacking the pressure loss adjustment plate 2. Because of a lack of the pressure loss adjustment plate 2, a distance between the edge of the wafer W and the side wall of the heating chamber 3 is 5 mm.
Results FIG. 16A shows the simulation result of the simulation 1, in which streamlines are evenly distributed. This clearly indicates that the gas flows at substantially the same flow speed throughout the heating chamber 3. On the other hand, FIG. 16B shows the simulation result of the simulation 2, in which streamlines are closely distributed near both side walls of the heating chamber 3. This indicates that the gas flows faster near the side walls and slower above the center of the wafer W. From these results, it is understood that the flow speed of the gas can be evenly distributed when the pressure loss adjustment plate 2 is employed.

Although the present invention has been described in conjunction with the foregoing specific embodiments, the present invention is not limited to the embodiments specifically disclosed herein, but various alterations and modifications may be applied without departing from the scope of the invention set forth in accompanying claims.

The present application contains subject matter related to Japanese Patent Application No. 2007-024487 filed with the Japanese Patent Office on Feb. 2, 2007, the entire contents of which are incorporated herein by reference.

What is claimed is:

1. A heating apparatus comprising:
   a heating chamber that heats a substrate placed in the heating chamber with a heat plate opposing the substrate;
   a gas stream forming portion that creates a gas stream along a top surface of the substrate in the heating chamber;
   a pair of first plate members respectively located between a first inner side wall of the heating chamber and a first substrate edge opposing the first inner side wall, and between a second inner side wall of the heating chamber and a second substrate edge opposing the second inner side wall; and a second plate member located at an upstream position along the gas stream in relation to the substrate, wherein the pair of the first plate members and the second plate member are integrated, wherein the pair of the first plate members has substantially the same thickness as that of the substrate and is positioned at substantially the same level as that of the substrate, and wherein the pair of the first plate members are parallel to each other and the second plate member connects the pair of the first plate members so as to provide a U-shaped opened out portion.

2. The heating apparatus of claim 1, wherein the second plate member becomes thinner toward a direction opposite to a direction of the gas stream.

3. The heating apparatus of claim 1, wherein the pair of the first plate members is attached on a transfer portion that transfers the substrate to the heating chamber and supports the substrate in the heating chamber.

4. The heating apparatus of claim 3, wherein the transfer portion includes plural wires that support the back surface of the substrate.

5. The heating apparatus of claim 1, wherein the height of the heating chamber is three times or less of a thickness of the substrate to be heated in the heating chamber.

6. A substrate heating method of heating a substrate in a heating chamber, the method comprising:

transferring the substrate to the heating chamber so that the substrate opposes a heat plate provided in the heating chamber;

providing a pair of first plate members in the heating chamber so that the first plate members are respectively located between a first inner side wall of the heating chamber and a first substrate edge opposing the first inner side wall, and between a second inner side wall of the heating chamber and a second substrate edge opposing the second inner side wall;

providing a second plate member located at an upstream position along the gas stream in relation to the substrate;

heating the substrate with the heat plate; and creating a gas flow in one direction along the top surface of the substrate in the heating chamber, wherein the pair of the first plate members and the second plate member are integrated, wherein the pair of the first plate members has substantially the same thickness as that of the substrate and is positioned at substantially the same level as that of the substrate, and wherein the pair of the first plate members are parallel to each other and the second plate member connects the pair of the first plate members so as to provide a U-shaped opened out portion.

* * * * *